(12) United States Patent
Oikawa (10) Patent No.: US 7,400,547 B2
(45) Date of Patent: Jul. 15, 2008

(54) SEMICONDUCTOR INTEGRATED CIRCUIT WITH POWER-REDUCING STANDBY STATE

(75) Inventor: Kiyoharu Oikawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 11/412,122

(22) Filed: Apr. 27, 2006

(65) Prior Publication Data

US 2006/0245289 A1 Nov. 2, 2006

(30) Foreign Application Priority Data

Apr. 28, 2005 (JP) ............................. 2005-132523

(51) Int. Cl.
*G11C 7/00* (2006.01)

(52) U.S. Cl. ............... 365/229; 365/185.2; 365/185.21; 365/185.23; 365/205; 365/227

(58) Field of Classification Search ............. 365/185.2, 365/185.21, 185.23, 227, 229, 205
See application file for complete search history.

(56) References Cited

U.S. PATENT DOCUMENTS 6,418,075 B2 7/2002 Shimano et al.
6,856,549 B2 * 2/2005 Yamauchi .............. 365/185.25
7,046,573 B2 * 5/2006 Takazawa et al. ........... 365/229

OTHER PUBLICATIONS

Yasoji Suzuki, "A Semiconductor MOS Memory and it's Usage", Daily Publication Industrial Newspaper Publishing Company, Aug. 1990, pp. 82-83 and 2 cover pages.

* cited by examiner

*Primary Examiner*—Hoai V Ho
(74) *Attorney, Agent, or Firm*—Oblon, Spivak, McClelland, Maier & Neustadt, P.C.

(57) ABSTRACT

A semiconductor integrated circuit has a sense amplifier which senses and outputs data read out from memory cells connected to word lines and bit lines, and a read-out control circuit which has a standby state consuming minimum necessary power and a read state reading out the memory cells, and controls read-out of the memory cells, wherein the read-out control circuit includes, a bit line switching circuit which switches whether or not to transmit a potential on the bit line to an input terminal of the sense amplifier, and a first switching control circuit which controls the bit line switching circuit to prevent the potential on the bit line from being transmitted to the input terminal of the sense amplifier during a period of the standby state and a predetermined period after the standby state is released.

16 Claims, 9 Drawing Sheets

3
INTERNAL CONFIGURATION OF SENSE AMPLIFIER

F I G. 3

5
INTERNAL CONFIGURATION OF RS-F/F

F I G. 4

INTERNAL COFIGURATION OF PRECHARGE CONTROL CIRCUIT

F I G. 5

INTERNAL CONFIGURATION OF BIAS CONTROL CIRCUIT

F I G. 6

INTERNAL CONFIGURATION OF COLUMN DECODER (RDCOLDEC)

F I G. 7

INTERNAL CONFIGURATION OF COLUMN DECODER (COLDEC)

F I G. 8

INTERNAL CONFIGURATION OF ROW DECODER (ROWDEC)

F I G. 9

INTERNAL CONFIGURATION OF SOURCE POTENTIAL CONTROL CIRCUIT

SEMICONDUCTOR INTEGRATED CIRCUIT WITH POWER-REDUCING STANDBY STATE

CROSS REFERENCE TO RELATED APPLICATIONS

This application is based upon and claims the benefit of priority from the prior Japanese Patent Application No. 2005-132523, filed on Apr. 28, 2005, the entire contents of which are incorporated herein by reference.

BACKGROUND OF THE INVENTION

1. Field of the Invention

The present invention relates to a semiconductor integrated circuit that can be set to a standby state to reduce power consumption.

2. Related Art

Due to advances in integrated-circuit technology, memory-embedded system LYSIs have spread in which a memory and other various kinds of circuits are embedded in the same semiconductor chip. In particular, in recent years, system LSIs with a built-in electrically rewritable flash memory have been widely used.

In addition to a memory, a sense amplifier for reading out data from the memory is provided in system LSI. The sense amplifier senses a potential difference between a bit-line potential and a potential of the reference bit line.

Some of memory-embedded system LSIs of this kind are enabled to be set to a standby state (refer to "Semiconductor MOS Memory and Usage Thereof" by Yasoji Suzuki, $1^{st}$ copy/$1^{st}$ edition, published by "Nikkan Kogyo Newspaper Co., Ltd., Aug. 30, 1990). When being set to the standby state, the system LSI suspends its internal operation, whereby the power consumption can be reduced.

However, in this kind of conventional system LSIs having the standby state, it has been a problem that, immediately after the LSI is released from the standby state, a penetrating current flows by way of the bit line and the reference bit line from the power source to the ground, whereby power consumption increases.

In a system LSI with a built-in flash memory, when a penetrating current flows, the electric potential of the bit line fluctuates; therefore, a soft error may occur in which erroneous data is written in a floating gate of the flash memory.

SUMMARY OF THE INVENTION

According to one embodiment of the present invention, a semiconductor integrated circuit, comprising:

a sense amplifier which senses and outputs data read out from memory cells connected to word lines and bit lines; and a read-out control circuit which has a standby state consuming minimum necessary power and a read state reading out the memory cells, and controls read-out of the memory cells;

wherein the read-out control circuit includes:

a bit line switching circuit which switches whether or not to transmit a potential on the bit line to an input terminal of the sense amplifier; and a first switching control circuit which controls the bit line switching circuit to prevent the potential on the bit line from being transmitted to the input terminal of the sense amplifier during a period of the standby state and a predetermined period after the standby state is released.

According to one embodiment of the present invention, a microcomputer, comprising:

a cell array having a plurality of memory cells each connected to word lines and bit lines;

a plurality of sense amplifiers which are provided in units of the plurality of bit lines, sense and output data read out from the plurality of memory cells; and a read-out control circuit which has a standby state consuming minimum necessary power and a read state reading out the memory cells, and controls read-out of the memory cells;

wherein the read-out control circuit includes:

a bit line switching circuit which switches whether or not to transmit a potential on the bit line to an input terminal of the sense amplifier; and a first switching control circuit which controls the bit line switching circuit to prevent the potential on the bit line from being transmitted to the input terminal of the sense amplifier during a period of the standby state and a predetermined period after the standby state is released.

DETAILED DESCRIPTION OF THE INVENTION

An embodiment of the present invention will be explained below with reference to the accompanying drawings.

Figure 1:
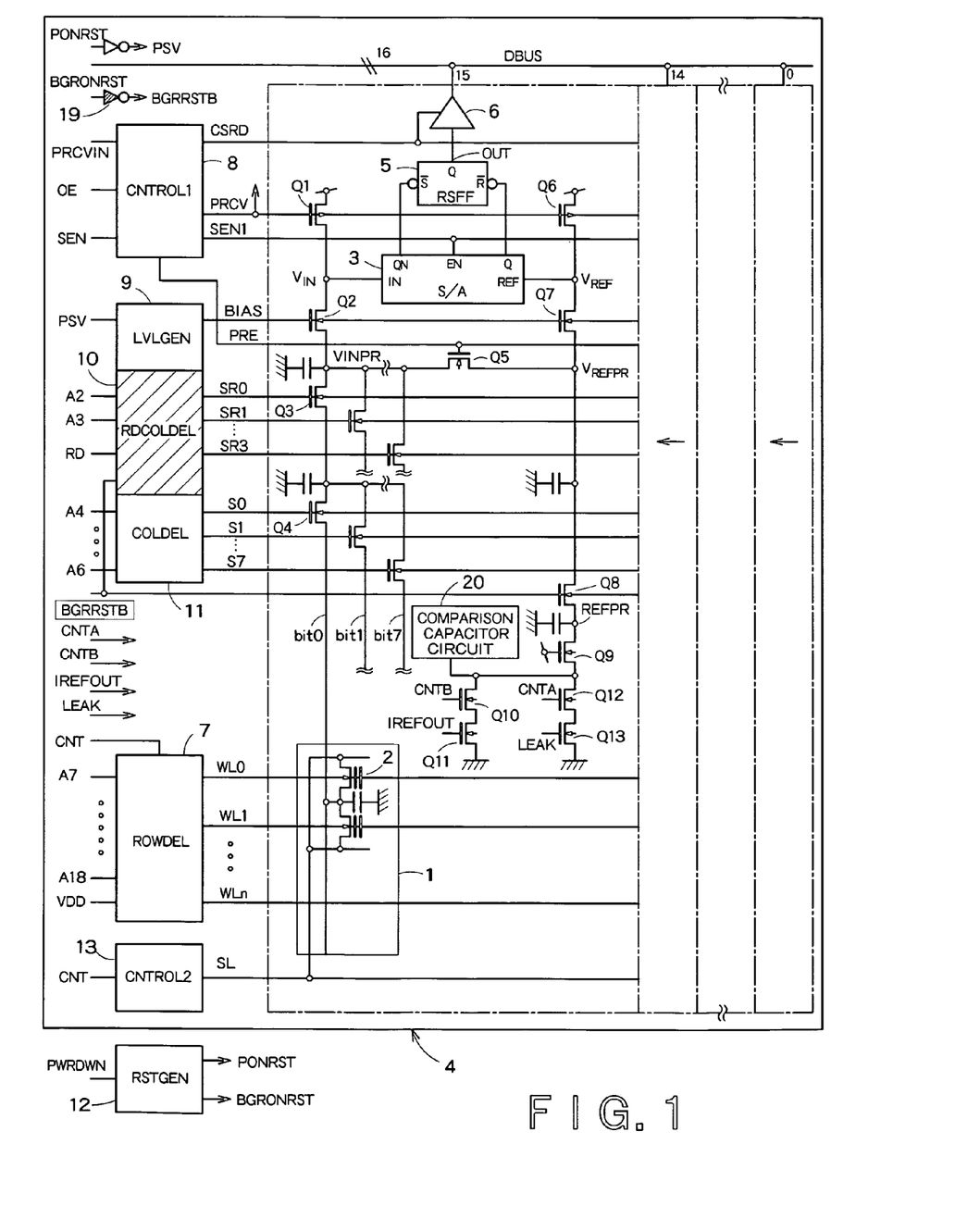
FIG. 1 is a block diagram illustrating a semiconductor integrated circuit according to an embodiment of the present invention.

FIG. 1 is a block diagram illustrating a semiconductor integrated circuit according to an embodiment of the present invention. The semiconductor integrated circuit in FIG. 1 constitutes a portion of internal configuration of a memory-embedded microcomputer system, and particularly FIG. 1 shows a block configuration of a read control circuit for the flash memory.

The microcomputer system in FIG. 1 includes a group of memory cells 1 constituting a flash memory, a sense amplifier (S/A) 3 that senses data read from each of the memory cells 2 in the group of memory cells 1 and outputs the data, and a read control circuit 4 that controls the reading of data from the memory cells 2. In addition, in FIG. 1, the other circuits, such as a write control circuit and the like, that are not directly related to the present invention are omitted.

The sense amplifier 3 senses the potential difference between electric potentials of a bit line for supplying data read out from the memory cell 2 and the reference bit line for supplying the reference potential. An RS flip-flop (RS-F/F) 5 is connected to the output of the sense amplifier 3, and a buffer 6 is connected to the output of the RS-F/F 5.

Next, the configuration of the read control circuit 4 will be explained. Word lines WL0 to WLn are connected to the respective gates of the memory cells 2, and bit lines bit0 to bit7 are connected to the respective drains of the memory cells 2. The respective currents in the word lines are supplied by a row decoder (ROWDEC) 7. Four transistors Q1 to Q4 are connected in cascade on the bit line bit0.

Among the foregoing transistors, the transistor Q1 is On/OFF controlled through a signal from a precharge control circuit (CNTROL1) 8. The transistor Q2, for biasing bit lines, is On/OFF controlled by a bias generation circuit (LVLGEN) 9. The bias generation circuit 9 controls the transistor Q2 in such a way that the potential of the bit line becomes a predetermined potential (e.g., 1 V) during data reading time.

The transistor Q3 is On/OFF controlled through a decode output SR(0 to 3) of a column decoder (RDCOLDEC) 10 that decodes lower addresses A2 and A3. The transistor Q4 is On/OFF controlled through a decode output S (0 to 7) of a column decoder (COLDEC) 11 that decodes middle addresses A6 to A4.

An equalization transistor Q5 is connected between the bit line and the reference bit line. The transistor Q5 is On/OFF controlled through a signal PRE from a precharge control circuit (CNTROL1) 8. When the transistor Q5 turns ON, the bit line and the reference bit line have the same electric potential. The signal PRE turns ON/OFF in synchronization with a system clock PRCVIN.

Transistors Q6 to Q9 are connected in cascade to the reference bit line. As is the case with transistor Q1, the transistor Q6 is On/OFF controlled through the output signal of the precharge control circuit (CNTROL1) 8. As is the case with transistor Q2, the transistor Q7 is On/OFF controlled through the output signal of the bias generation circuit (LVLGEN) 9. As described later, the transistor Q8 is provided to prevent a penetrating current that occurs after the LSI is released from the standby state, and the transistor Q8 is On/OFF controlled through a signal BGRRSTB. The signal BGRRSTB is obtained by inversing through an inverter 19 a signal BGRONRST generated by a reset signal generation circuit (RSTGEN) 12.

A comparison capacitor circuit 20, two transistors Q10 and Q11 connected in cascade, and two transistors Q12 and Q13 connected in cascade are connected to the source of the transistor Q9 on the reference bit line REF. The comparison capacitor circuit 20 is provided to make the reference bit line have the same capacitance as that of the bit line. The transistors Q10 and Q11 turn ON at the time of normal reading, and the transistors Q12 and Q13 turn ON at the time of erasing. The transistor Q13 is provided to monitor over-erasure.

A signal from a source potential control circuit (CNTROL2) 13 is supplied to the source of the memory cell 2. At the time of reading the memory cell, the drain voltage (bit0) is set to approximately 1 V.

Figure 2:
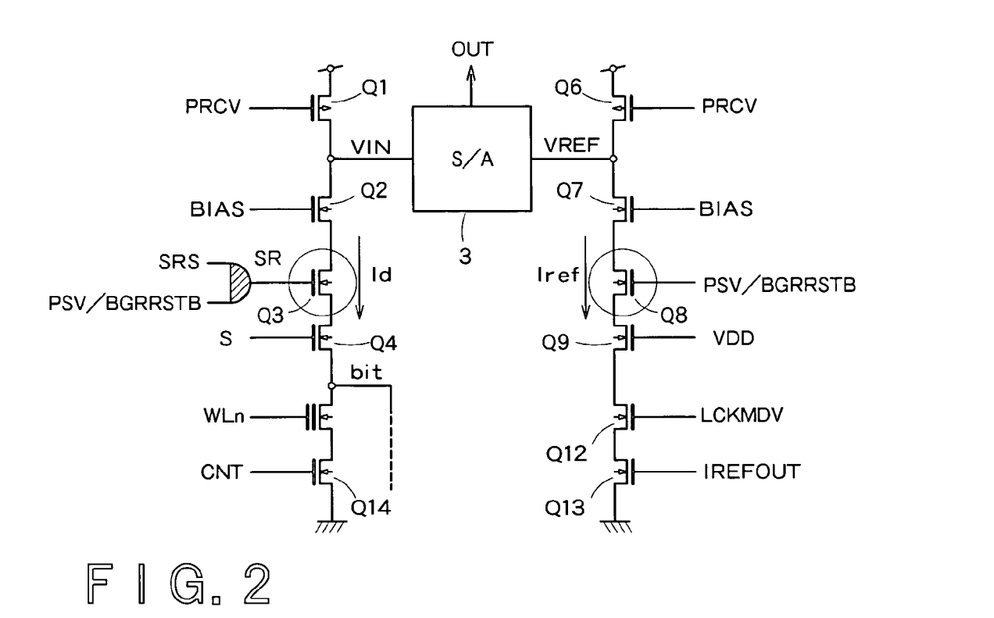
FIG. 2 is an equivalent circuit diagram for the vicinities of the sense amplifier 3.

FIG. 2 is an equivalent circuit diagram for the vicinities of the sense amplifier 3. As illustrated in FIG. 2, the sense amplifier 3 is connected between the current path of the bit line and the current path of the reference bit line. The transistors Q1 to Q4 and a transistor Q14 are connected in cascade on the current path of the bit line. In addition, in the current path of the reference bit line, the transistors Q6 to Q13 are connected in cascade.

In the present embodiment, until a predetermined time elapses after the LSI is released from the standby state, the transistor Q3 on the current path of the bit line and the transistor Q8 on the current path of the reference bit line are set not to be turned ON, respectively. Accordingly, no penetrating current flows through both the current paths after the LSI is released from the standby state; therefore, power consumption can be reduced. Moreover, during the predetermined time, the potentials of the bit lines are maintained low; therefore, erroneous writing in the memory cell is prevented, whereby occurrence of soft errors can be prevented. The transistor Q3 functions as a bit line switching circuit that switches whether to transmit the potential on the bit line to the input terminal of the sense amplifier 3.

Respective specific circuit configurations in the blocks illustrated in FIG. 1 is not limited in particular. An example of a circuit configuration in each block will be explained below.

Figure 3:
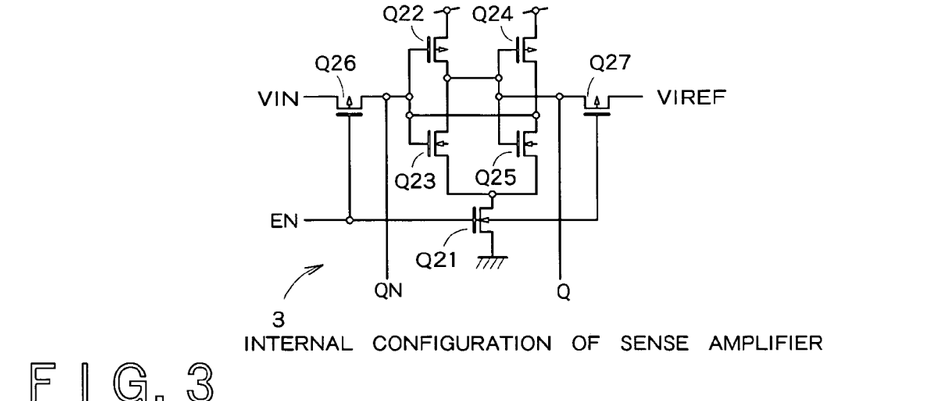
FIG. 3 is a circuit diagram illustrating an example of the internal configuration of the sense amplifier 3.

FIG. 3 is a circuit diagram illustrating an example of the internal configuration of the sense amplifier 3. The sense amplifier 3 in FIG. 3 includes a PMOS transistor Q22 and an NMOS transistor Q23 that are connected in cascade between the power supply voltage source and the drain of an NMOS transistor Q21, and a PMOS transistor Q24 and an NMOS transistor Q25 that are connected in cascade between the power supply voltage source and the drain of an NMOS transistor Q21. The gates of the PMOS transistor Q22 and the NMOS transistor Q23 are connected to the respective drains of the PMOS transistor Q24, the NMOS transistor Q25, and a PMOS transistor Q26. The gates of the PMOS transistor Q24 and the NMOS transistor Q25 are connected to the respective drains of the PMOS transistor Q22, the NMOS transistor Q23, and a PMOS transistor Q27. A signal EN is inputted to the respective gates of the transistors Q21, Q26 and Q27. The source of the transistor Q1 is connected to the ground potential.

The sense amplifier 3 in FIG. 3 outputs differential voltages Q or QN, in accordance with the potential difference between a voltage VIN at the bit line and a voltage VREF at the reference bit line.

Figure 4:
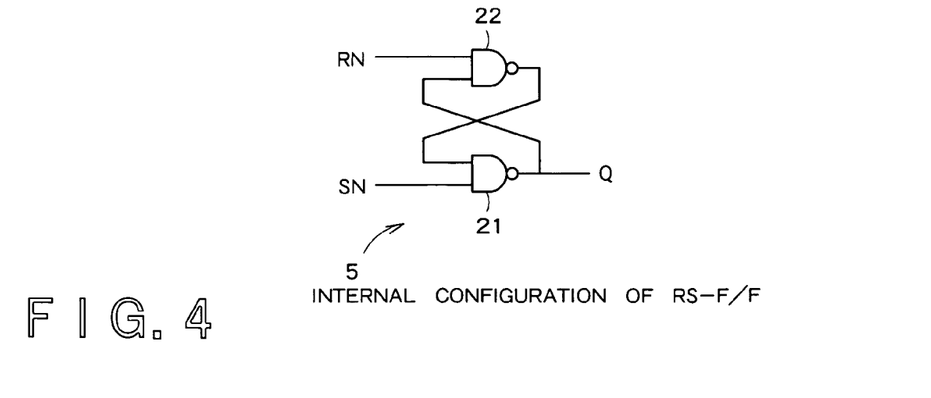
FIG. 4 is a circuit diagram illustrating an example of the internal configuration of the RS-F/F 5 connected to the sense amplifier 3.

FIG. 4 is a circuit diagram illustrating an example of the internal configuration of the RS-F/F 5 connected to the sense amplifier 3. The RS-F/F 5 in FIG. 4 consists of two NAND circuits 21 and 22. The one NAND circuit 21 outputs a signal obtained by inverting the sign of the product of the logical multiplication of a set signal SN and the output signal of the other NAND circuit 22, and the other NAND circuit 22 outputs a signal obtained by inverting the sign of the product of the logical multiplication of a reset signal RN and the output signal of the one NAND signal 21.

Figure 5:
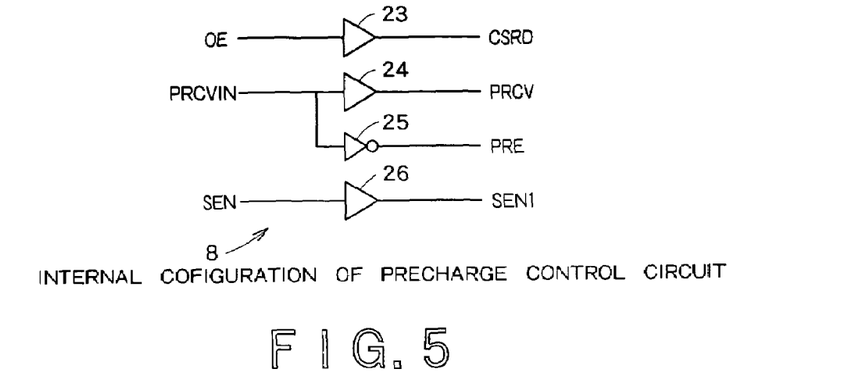
FIG. 5 is a circuit diagram illustrating an example of the internal configuration of the precharge control circuit 8.

FIG. 5 is a circuit diagram illustrating an example of the internal configuration of the precharge control circuit 8. The precharge control circuit 8 in FIG. 5 includes a buffer 23 that creates an enable signal CSRD for a driver arranged after the RS-F/F 5, a buffer 24 that makes a signal PRCV for ON/OFF-controlling the transistors, a buffer 25 that makes a signal PRE for ON/OFF-controlling the precharge transistor, and a buffer 26 that makes an enable signal SENI for the sense amplifier 3.

Figure 6:
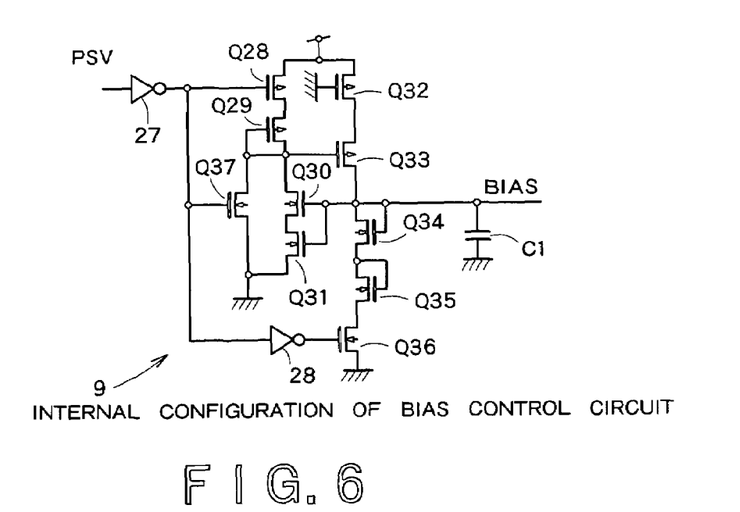
FIG. 6 is a circuit diagram illustrating an example of the internal configuration of the bias generation circuit 9.

FIG. 6 is a circuit diagram illustrating an example of the internal configuration of the bias generation circuit 9. The bias generation circuit 9 in FIG. 6 includes PMOS transistors Q28 and Q29 and NMOS transistors Q30 and Q31 that are connected in cascade between the power supply voltage source and the ground, PMOS transistors Q32 and Q33 and NMOS transistors Q34, Q35, and Q36 that are connected in cascade between the power supply voltage source and the ground, and a transistors Q37 that is connected between the gate of the transistor Q29 and the ground. A signal obtained by inverting a signal PSV obtained by inverting the output signal PONRST of the reset signal generation circuit 12 by the inverter 27 is inputted to the gate of the transistor Q28. The gate of the transistor 36 is supplied with a signal obtained by inverting the output signal of the inverter 27 by the inverter 28. A signal BIAS is outputted from the drain of the transistor Q33. A total parasitic capacitor C1 between a junction parasitic capacitance of the bias generation circuit 9, the gate parasitic capacitances of the transistors Q 2 and Q7, and the parasitic capacitance of the BIAS line itself are connected to the BIAS line.

The bias generation circuit 9 in FIG. 6 performs control so that when the signal PSV is "High" (in the case of normal reading), the transistor Q36 turns ON and the signal BIAS becomes approximately 2 V. In contrast, when the signal PSV is "Low" (during the standby state), the transistors Q37 and Q33 turn ON, whereby a voltage having the level of the power supply voltage is outputted.

Figure 7:
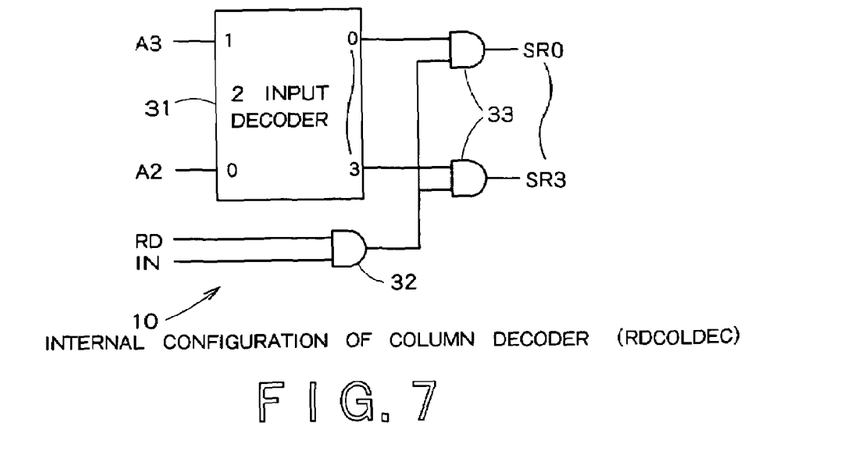
FIG. 7 is a circuit diagram illustrating an example of the internal configuration of the column decoder 10.

FIG. 7 is a circuit diagram illustrating an example of the internal configuration of the column decoder 10. The column decoder 10 in FIG. 7 has a two-input decoder 31 that decodes lower addresses A2 and A3, an AND gate 32 that outputs a signal, which is the product of the logical multiplication of a read-out signal RD and an input signal IN, and AND gates 33 that each output a signal, which is the product of the logical multiplication of an output signal of the two-input decoder 31 and the output signal of the AND gate 32.

In accordance with the logic levels of the lower addresses A2 and A3, only one of the four output signals SR (0 to 3) becomes "High". The column decoder 10 functions as a first switching controller which performs control so that the potential of the bit line is not transmitted to the input terminal of the sense amplifier 3 during the standby period and the predetermined period after the standby state is released.

Figure 8:
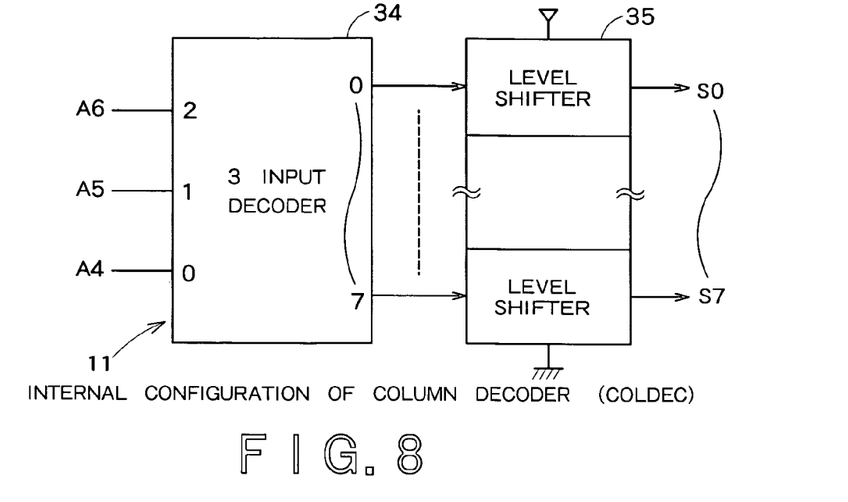
FIG. 8 is a circuit diagram illustrating an example of the internal configuration of the column decoder 11.

FIG. 8 is a circuit diagram illustrating an example of the internal configuration of the column decoder 11. The column decoder 11 in FIG. 8 has a three-input decoder 34 that decodes middle addresses A6 to A4, and a level shifter 35 that shifts the respective levels of eight output signals of the three-input decoder 34. Signals S (0 to 7) are outputted from the level shifter 35.

Figure 9:
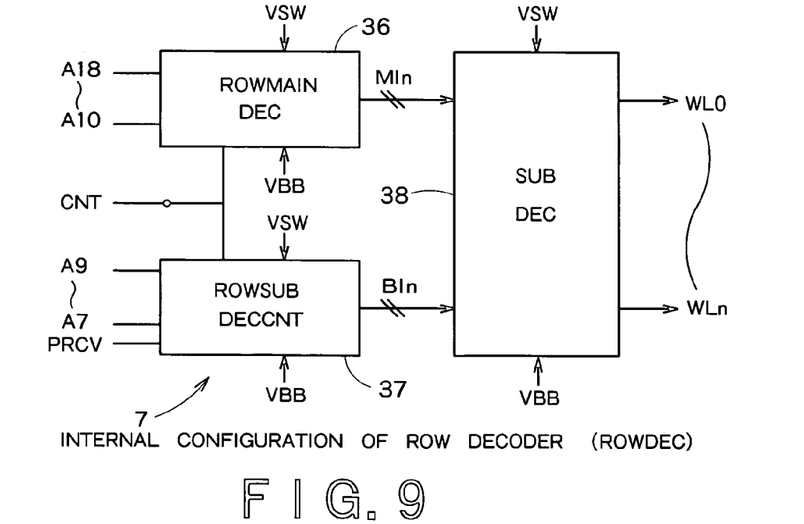
FIG. 9 is a circuit diagram illustrating an example of the internal configuration of the row decoder 7.

FIG. 9 is a circuit diagram illustrating an example of the internal configuration of the row decoder 7. The row decoder 7 in FIG. 9 has a first row decoder (ROWMAINDEC) 36 that decodes most significant addresses A18 to A10, a second row decoder (ROWSUBDEC) 37 that decodes upper addresses A9 to A7, and a subdecoder (SUBDEC) 38 connected to the first and second row decoders 36 and 37. Word-line signals WL0 to WLn are outputted from the subdecoder 38.

Figure 10:
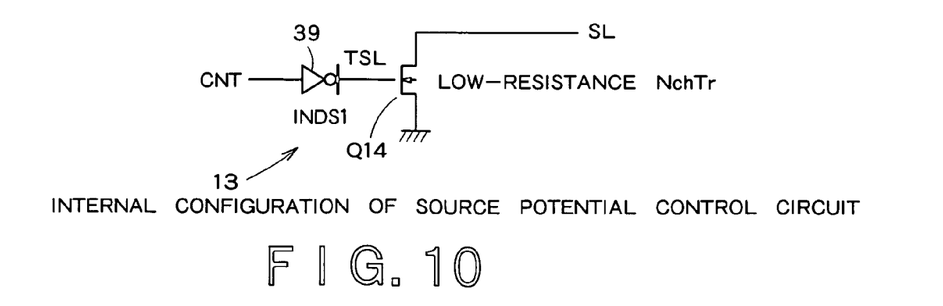
FIG. 10 is a circuit diagram illustrating an example of the internal configuration of the source potential control circuit 13.

FIG. 10 is a circuit diagram illustrating an example of the internal configuration of the source potential control circuit 13. The source potential control circuit 13 in FIG. 10 has an NMOS transistor Q14 and an inverter 39 connected to the gate of the transistor Q14. When a signal CNT is "Low", the transistor Q14 turns ON.

Figure 11:
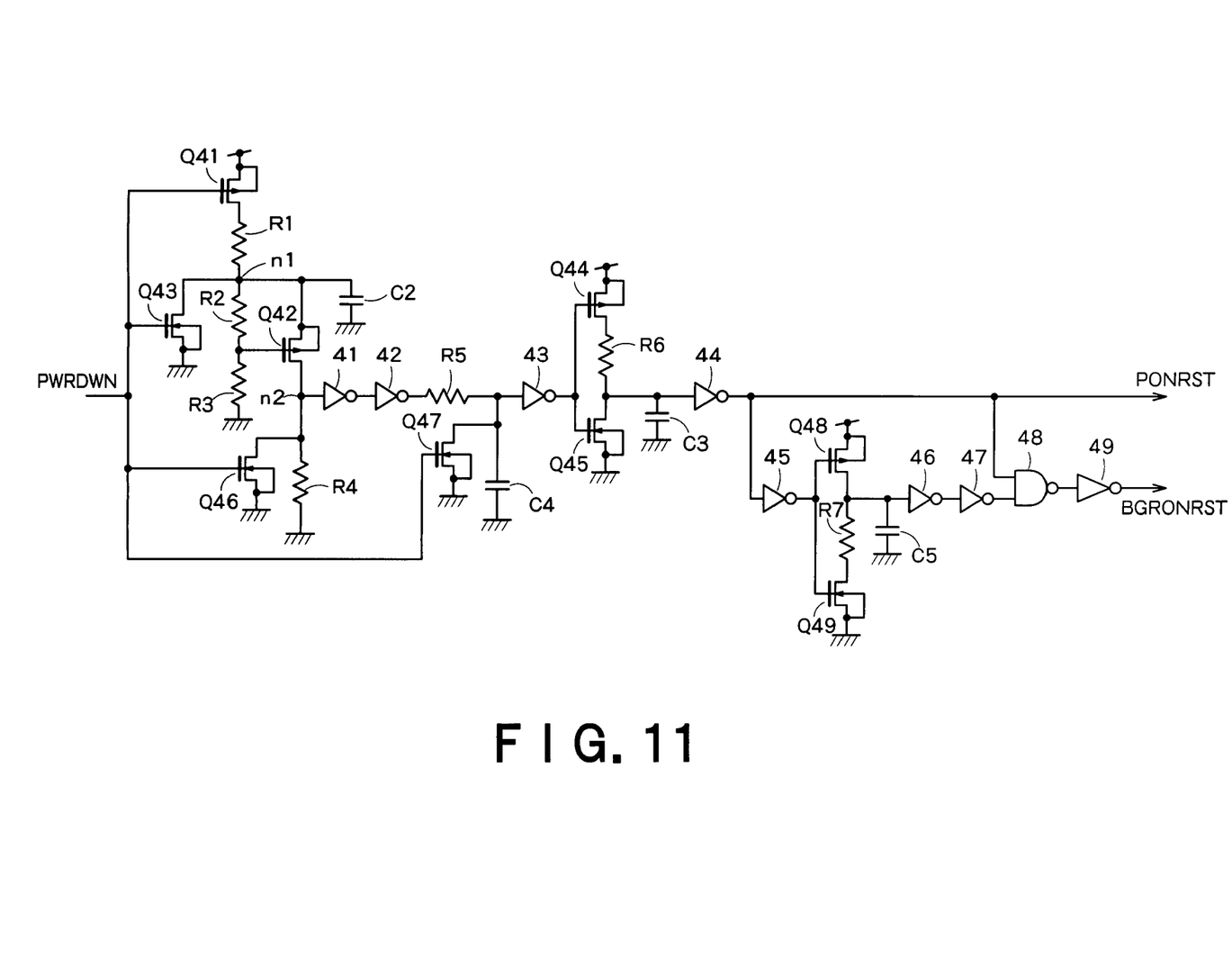
FIG. 11 is a circuit diagram illustrating an example of the internal configuration of the reset signal generation circuit 12.

FIG. 11 is a circuit diagram illustrating an example of the internal configuration of the reset signal generation circuit 12.

The reset signal generation circuit 12 in FIG. 11 has a transistor Q14 and resistors R1, R2, and R3 that are connected in cascade between the power supply voltage source and the ground, a transistor Q42 and a resistor R4 that are connected in series between a connection node n1 between the resistors R1 and R2 and the ground, a transistor Q43 and capacitor C2 that are connected in parallel between the connection node n1 and the ground, inverters 41 and 42, a resistor R5, and an inverter 43 that are connected in series to a connection node n2 between the transistor Q42 and the resistor R4, and a delay circuit consisting of a transistor Q44, a resistor R6 and a transistor Q45, and an inverter 44. A capacitor C3 is connected between the input terminal of the inverter 44 and the ground terminal, and the signal PONRST is outputted from the inverter 44. A transistor Q46 is connected between the node n2 and the ground terminal. A transistor Q47 and a capacitor C4 are connected in parallel to the connection node between the resistor R5 and the inverter 43. The signal PONRST is inputted to the inverter 45. Immediately after the inverter 45, a delay circuit consisting of a transistor Q48, a resistor R7, and a transistor Q49 is connected. A capacitor C5, inverters 46 and 47, a NOR circuit 48, and an inverter 49 are connected at subsequent stage of the delay circuit, The circuitry in FIG. 11 raises the signals PONRST and BGRONRST, in synchronization with the rise of a signal PWRDOWN. Additionally, when the signal PWRDOWN falls, the signal PONRST is raised with some delay, and then the signal BGRONRST is lowered after a predetermined time. The reset signal generation circuit 12 functions as a second switching control circuit which performs control so that the potential on the reference bit line is not transmitted to the input terminal of the sense amplifier 3 during the standby period and the predetermined period after the standby state is released.

Figure 12:
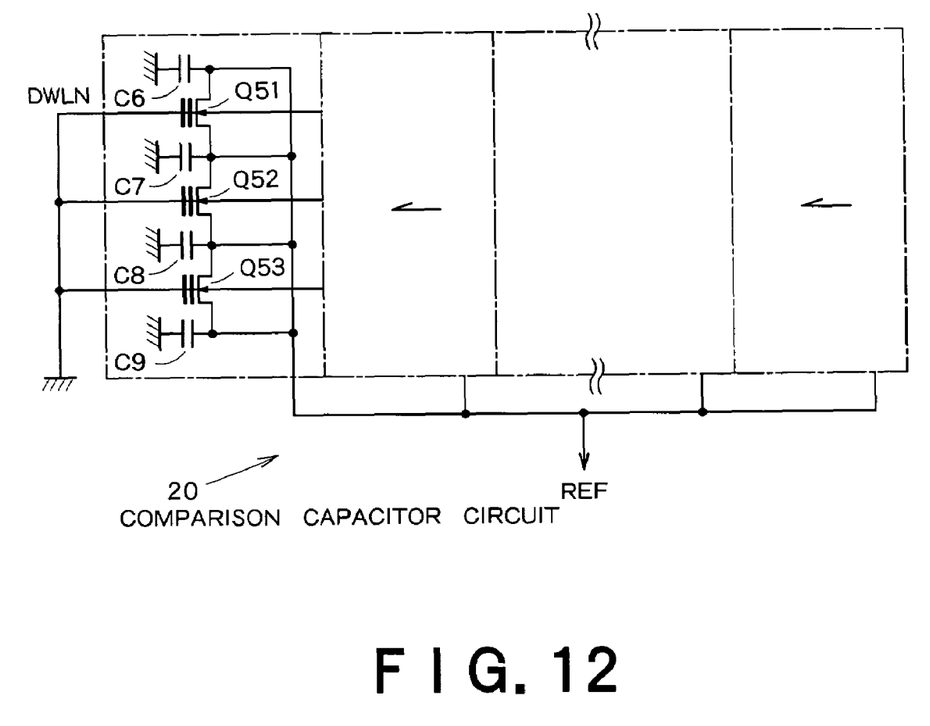
FIG. 12 is a circuit diagram illustrating an example of the internal configuration of the comparison capacitor circuit 20.

FIG. 12 is a circuit diagram illustrating an example of the internal configuration of the comparison capacitor circuit 20. The comparison capacitor circuit 20 in FIG. 12 has drain-junction parasitic capacitors C6 to C9 and NMOS transistors Q51 to Q53 connected between the capacitors. The comparison capacitor circuit 20 is provided to make the reference bit line have the same capacitance as that of the bit line.

Figure 13:
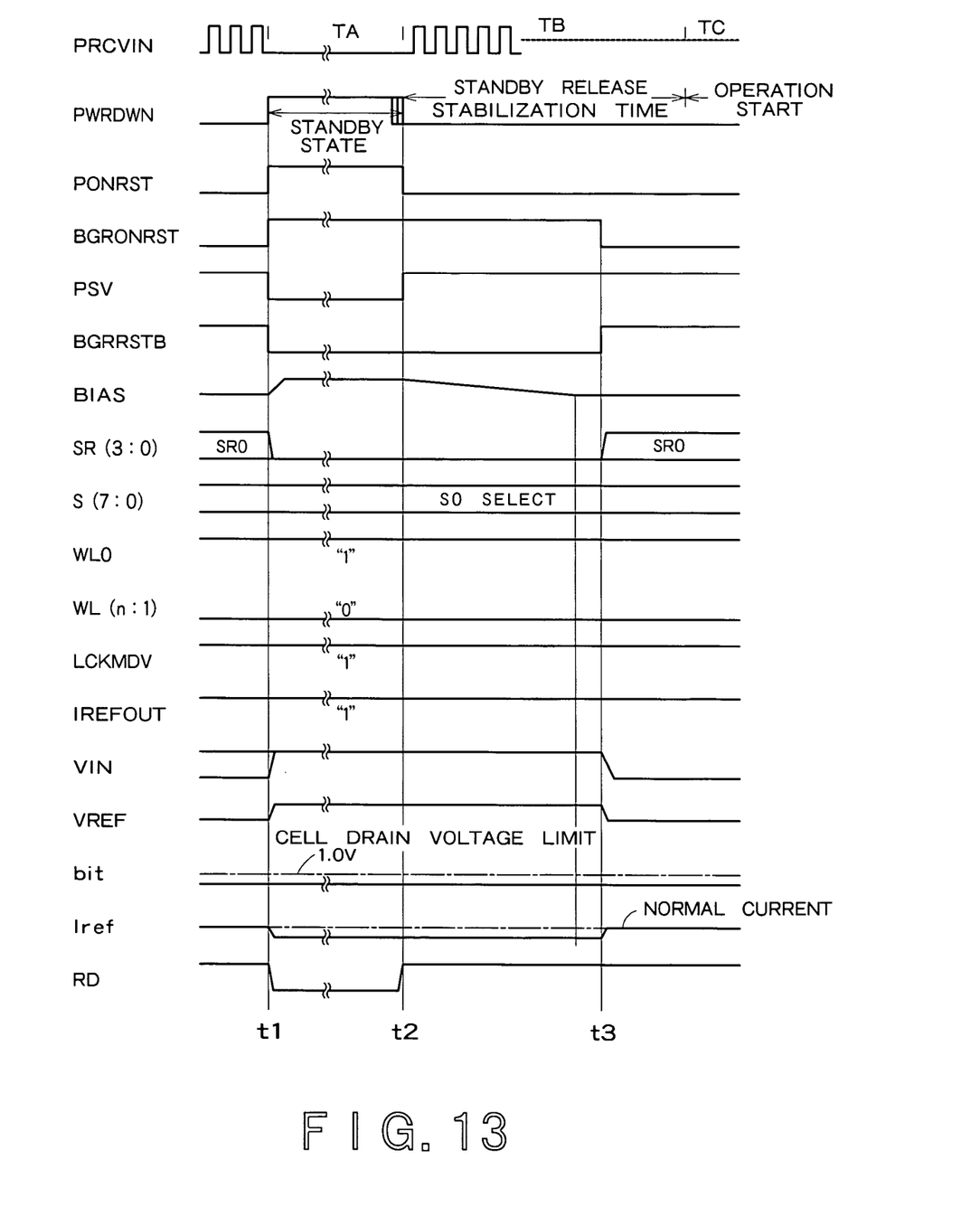
FIG. 13 is an operation timing chart of the present embodiment.

FIG. 13 is an operation timing chart of the present embodiment. The operation of the present embodiment will be explained below with reference to the operation timing chart. The operation timing chart in FIG. 13 represents an example of the operation in which the device changes its state from the normal reading state to the standby state, and then returns to the normal reading state. Additionally, it is assumed that the word line WL0 is selected.

The signal PRCVIN is a system clock; in synchronization with the clock, precharge of the bit lines and the reference bit line and reading of the memory cell 2 are implemented.

When the signal PWRDWN becomes "High" at the timing t1, the standby state begins. The signal PWRDWN is inputted to the reset signal generation circuit 12 whose detailed configuration is illustrated in FIG. 11.

The reset signal generation circuit 12 makes both the signals PONRST and BGRONRST "High", in synchronization with the rise of the signal PWRDOWN. Additionally, the signal PSV becomes "Low", whereby the electric potential of the output signal BIAS of the bias generation circuit 9 whose detailed configuration is illustrated in FIG. 6 is raised. Accordingly, the bias generation circuit 9 applies to the transistor Q2 a bias for making the drain of the transistor Q2 have the same potential as that of the power supply voltage source. Additionally, the signal BGRONRST becomes "High", whereby the output signals SR (0 to 3) of the column decoder 10 whose detailed configuration is illustrated in FIG. 7 become "Low".

In the example in FIG. 13, during the duration between the timing t1 and the timing t2, the standby state is maintained. In that duration, the reading signal RD is "Low". Additionally, in the standby period, both the input voltages VIN and VREF have the same potential as that of the power supply voltage source.

When, at the timing t2, the signal PWRDWN becomes "Low" and the LSI is released from the standby state, the reset signal generation circuit 12 whose detailed configuration is illustrated in FIG. 11 makes the signal PONRST "Low". In contrast, the signal BGRONRST is delayed by the inverter 45 and the delay circuit consisting of transistors Q48 and Q49 and the resistor R7, and becomes "LOW" at the timing t3 when a predetermined time has elapsed after the signal RWRDWN becomes "LOW". The duration between the timings t2 and t3 is a stabilization period after the release of the LSI from the standby state.

As described above, during the duration between the timings t2 and t3, the signal BGRONRST is still "High". Therefore, the signal BGRONSTB becomes "Low", whereby the output signal SR (0 to 3) of the column decoder 10 whose detailed configuration is illustrated in FIG. 7 becomes "Low" and the transistor Q3 is in its OFF state. Similarly, the transistor Q8 on the current path of the reference bit line is also in its OFF state. Accordingly, during the duration between the timings t2 and t3, not only the current path through which, by way of the bit line, a current flows from the power supply voltage source to the ground, but also the current path through which, by way of the reference bit line, a current flows from the power supply voltage source to the ground is cut off. As a result, power consumption is reduced.

Additionally, during the duration between the timings t2 and t3, the electric potential of the output signal BIAS of the bias generation circuit 9 whose detailed configuration is illustrated in FIG. 6 gradually decreases and stabilizes at the timing immediately before the timing t3. Therefore, it is preferable that the timing t3 when the signal BGRONRST becomes "Low" is set in synchronization with the timing when the electric potential of the signal BIAS stabilizes.

As described above, during the duration between the timings t2 and t3, both the transistor Q3 on the current path of the bit line and the transistor Q8 on the current path of the reference bit line are in their OFF states. Therefore, the input voltages VIN and VREF of the sense amplifier 3 have the same electric potential as that of the power supply voltage source.

After the timing t3, the transistor Q3 connected to the column decoder 10 turns ON, whereby data read from the memory cell 2 is supplied to the input terminal IN of the sense amplifier 3, by way of the bit line. Similarly, the transistor Q8 in the reference bit line also turns ON, whereby the input terminal REF of the sense amplifier 3 is set to the reference electric potential. Accordingly, the sense amplifier 3 implements the sensing operation, in response to the data stored in the memory cell 2, thereby reading and outputting the data.

Figure 14:
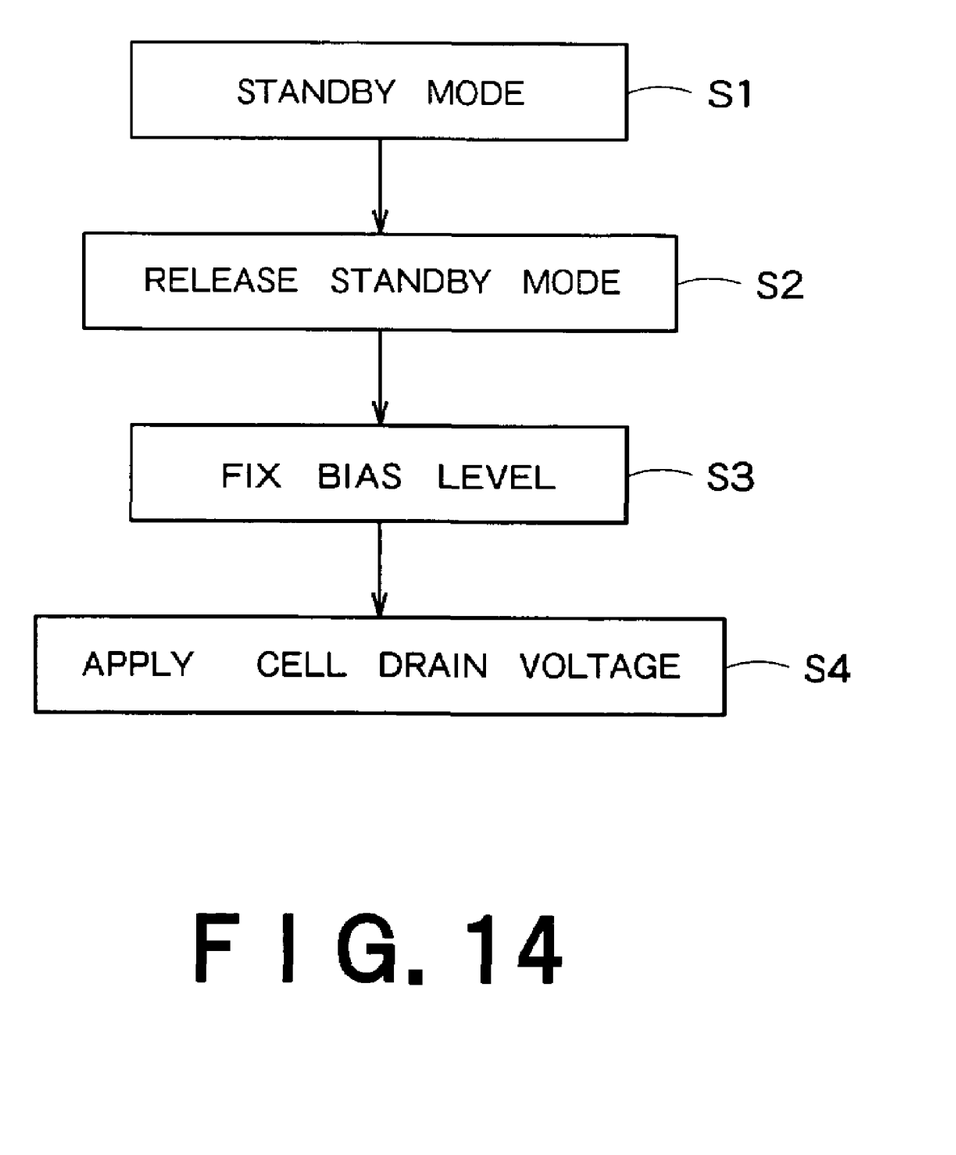
FIG. 14 is a sequence chart illustrating the state transitions.

As illustrated in the timing chart in FIG. 13, in the present embodiment, four state transitions occur upon the release of LSI from the standby state. FIG. 14 is a sequence chart illustrating the state transitions. When the LSI is released from the standby state in the step S1 (in the step S2), the bias level is fixed (in the step S3) after the signal BIAS for setting the electric potential of the bit line stabilizes. and then, to the drain of the memory cell, 1 V that is a voltage for reading is applied (in the step S4).

Figure 15:
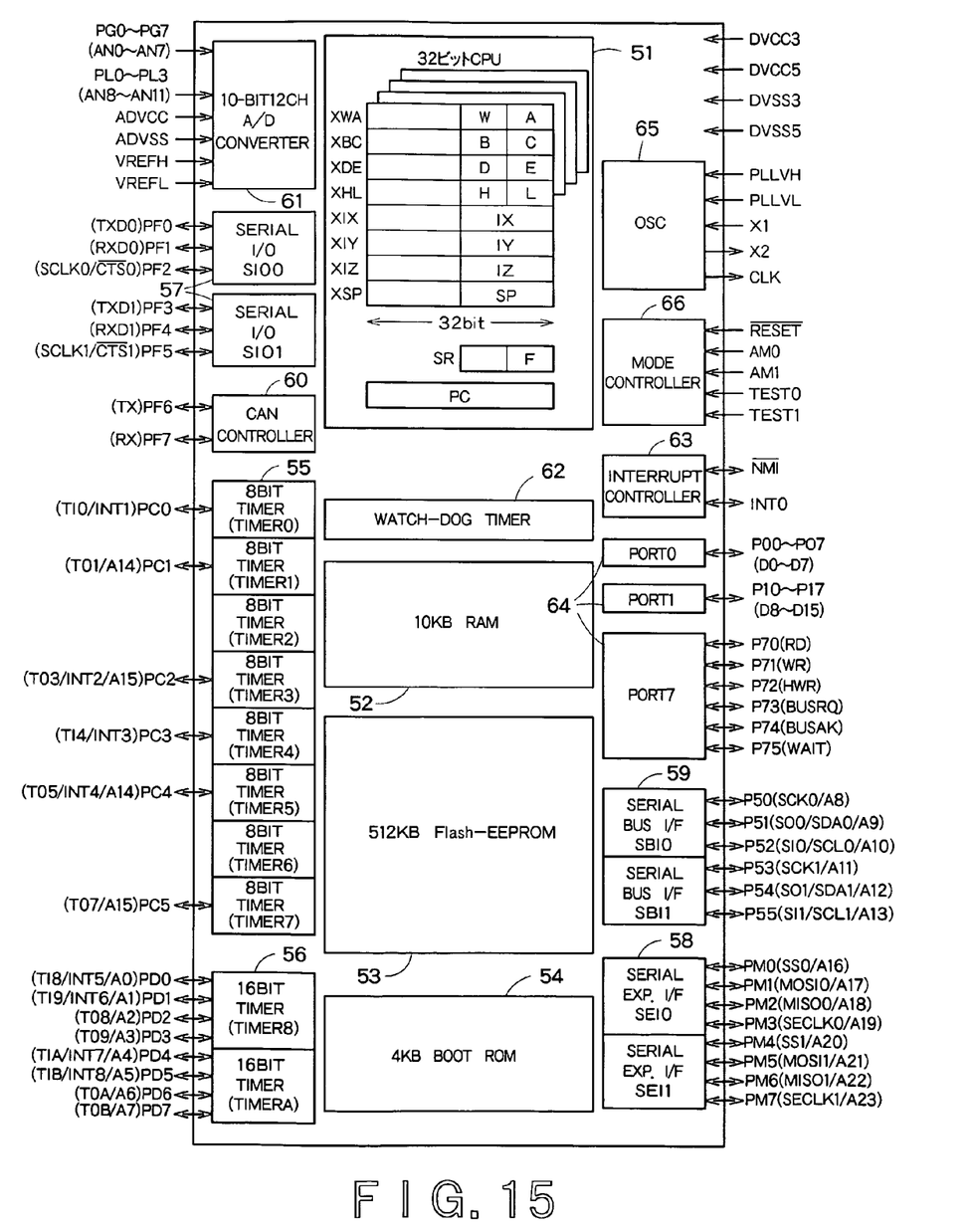
FIG. 15 is a block diagram illustrating the schematic configuration of an entire microcomputer system including the block configuration in FIG. 1.

FIG. 15 is a block diagram illustrating the schematic configuration of an entire microcomputer system including the block configuration in FIG. 1. The microcomputer system in FIG. 15 includes a 32-bit CPU (Central Processing Unit) 51, a RAM 52, a flash memory 53 partially illustrated in FIG. 1, a mask ROM 54, an 8-bit timer circuit 55, a 16-bit timer circuit 56, an SIO (Serial interface) circuit 57, an SEI (Serial Expansion Interface) circuit 58, an SBI (Serial Bus Interface) circuit 59, a CAN (Can Controller) circuit 60 for communication control, an ADC (10-bit A/D converter) 61, a watchdog timer circuit 62 for detecting a runaway, an interrupt controller 63, an I/O port 64, an internal-clock generation circuit (OSC) 65, and a mode controller circuit 66.

The specific internal configuration of the microcomputer system is not limited to that illustrated in FIG. 15. Moreover, the present invention is not necessarily required to be utilized in a microcomputer system, but can be applied to a memory controller or any of various kinds of system LSIs.

As discussed above, in the present embodiment, within a predetermined time after the release of the LSI from the standby state, the transistor Q3 on the current path of the bit line and the transistor Q8 on the current path of the reference bit line are both turned to OFF. Therefore, both the current paths are cut off, whereby no penetrating current flows, by way of the bit line and the reference bit line, from the power supply voltage source to the ground, thereby reducing the power consumption.

Moreover, within the predetermined time after the release of the LSI from the standby state, the potential of the bit lines is maintained low. Therefore, erroneous writing (so-called a soft error) in the memory cell 2 is prevented.

In the present embodiment described above, an example for performing reading control of the flash memory has been described. However, the present invention can also be applied to any of other various kinds of memories (such as an EPROM and a mask ROM).

What is claimed is:

1. A semiconductor integrated circuit, comprising:
   a sense amplifier which senses and outputs data read out from memory cells connected to word lines and bit lines, the sense amplifier outputting data in accordance with a potential difference between the potential on the bit line and the potential on a reference bit line; and
   a read-out control circuit which has a standby state consuming minimum necessary power and a read state reading out the memory cells, and controls read-out of the memory cells;
   wherein the read-out control circuit includes:
      a bit line switching circuit which switches whether or not to transmit a potential on the bit line to an input terminal of the sense amplifier;
      a first switching control circuit which controls the bit line switching circuit to prevent the potential on the bit line from being transmitted to the input terminal of the sense amplifier during a period of the standby state and a predetermined period after the standby state is released; and
      a second switching control circuit which controls the bit line switching circuit to prevent the potential on the reference bit line from being transmitted to the corresponding input terminal of the sense amplifier during the period of the standby state and a predetermined period after the standby state is released.

2. The semiconductor integrated circuit according to claim 1,
   wherein the first switching control circuit sets the input terminal of the sense amplifier to a predetermined reference voltage level during the period of the standby state and the predetermined period after the standby state is released.

3. The semiconductor integrated circuit according to claim 1,
wherein the first switching control circuit switches whether or not to transmit the potential on the bit line to the corresponding input terminal of the sense amplifier based on a bit line potential control signal on which a logic inverts at a predetermined period after the standby state elapses; and
the second switching control circuit switches whether or not to transmit the potential on the reference bit line to the corresponding input terminal of the sense amplifier based on the bit line potential control signal.

4. The semiconductor integrated circuit according to claim 1,
wherein the read-out control circuit includes:
a bias transistor which sets the bit line to a predetermined potential at the timing of reading out the memory cells; and
a bias control circuit which controls a gate voltage of the bias transistor;
wherein the first and second switching control circuit decide the predetermined period in conformity to a time when the gate voltage of the bias transistor stabilizes after the standby state is released.

5. The semiconductor integrated circuit according to claim 4,
wherein the first and second switching control circuit decide the predetermined period in conformity to a time when fluctuation of the gate voltage of the bias transistor does not exist any more after the standby state is released.

6. The semiconductor integrated circuit according to claim 1,
wherein the bit line switching circuit has a plurality of transistors which switch whether or not to transmit the potential on the bit line to the input terminal of the sense amplifier and are connected to a plurality of bit lines, respectively; and
the first switching control circuit turns off the plurality of transistors during the period of the standby state and the predetermined period after the standby state is released.

7. The semiconductor integrated circuit according to claim 6,
wherein the first switching control circuit turns on one of the plurality of transistors at the predetermined period after the standby state is released.

8. The semiconductor integrated circuit according to claim 1,
wherein the memory cells are memory cells of a flash memory; and
the first switching control circuit is a decoder which decodes a portion of addresses of the flash memory.

9. A microcomputer, comprising:
a cell array having a plurality of memory cells each connected to word lines and bit lines;
a plurality of sense amplifiers which are provided in units of the plurality of bit lines, sense and output data read out from the plurality of memory cells, each the sense amplifier outputting data in accordance with a potential difference between the potential on the bit line and the potential on a reference bit line; and
a read-out control circuit which has a standby state consuming minimum necessary power and a read state reading out the memory cells, and controls read-out of the memory cells;
wherein the read-out control circuit includes:
a bit line switching circuit which switches whether or not to transmit a potential on the bit line to an input terminal of the corresponding sense amplifier;
a first switching control circuit which controls the bit line switching circuit to prevent the potential on the bit line from being transmitted to the input terminal of the corresponding sense amplifier during a period of the standby state and a predetermined period after the standby state is released; and
a second switching control circuit which controls the bit line switching circuit to prevent the potential on the reference bit line from being transmitted to the input terminal of the corresponding sense amplifier during the period of the standby state and the predetermined period after the standby state is released.

10. The microcomputer according to claim 9,
wherein the first switching control circuit sets the input terminal of the sense amplifier to a predetermined reference voltage level during the period of the standby state and the predetermined period after the standby state is released.

11. The microcomputer according to claim 9,
wherein the first switching control circuit switches whether or not to transmit the potential on the bit line to the corresponding input terminal of the sense amplifier based on a bit line potential control signal on which a logic inverts at a predetermined period after the standby state elapses; and
the second switching control circuit switches whether or not to transmit the potential on the reference bit line to the corresponding input terminal of the sense amplifier based on the bit line potential control signal.

12. The microcomputer according to claim 9,
wherein the read-out control circuit includes:
a bias transistor which sets the bit line to a predetermined potential at the timing of reading out the memory cells; and
a bias control circuit which controls a gate voltage of the bias transistor;
wherein the first and second switching control circuit decide the predetermined period in conformity to a time when the gate voltage of the bias transistor stabilizes after the standby state is released.

13. The microcomputer according to claim 12,
wherein the first and second switching control circuit decide the predetermined period in conformity to a time when fluctuation of the gate voltage of the bias transistor does not exist any more after the standby state is released.

14. The microcomputer according to claim 9,
wherein the bit line switching circuit has a plurality of transistors which switch whether or not to transmit the potential on the bit line to the input terminal of the sense amplifier and are connected to a plurality of bit lines, respectively; and
the first switching control circuit turns off the plurality of transistors during the period of the standby state and the predetermined period after the standby state is released.

15. The microcomputer according to claim 14,
wherein the first switching control circuit turns on one of the plurality of transistors at the predetermined period after the standby state is released.

16. The microcomputer according to claim 9,
wherein the memory cells are memory cells of a flash memory; and
the first switching control circuit is a decoder which decodes a portion of addresses of the flash memory.

* * * * *